United States Patent [19]

Leung et al.

[11] Patent Number: 5,023,893
[45] Date of Patent: Jun. 11, 1991

[54] TWO PHASE NON-OVERLAPPING CLOCK COUNTER CIRCUIT TO BE USED IN AN INTEGRATED CIRCUIT

[75] Inventors: Ho-Ming Leung, San Francisco; Edward T. Pak, Fremont, both of Calif.

[73] Assignee: Advanced Micro Devices, Inc., Sunnyvale, Calif.

[21] Appl. No.: 258,745

[22] Filed: Oct. 17, 1988

[51] Int. Cl.[5] .................... H03K 23/44; H03K 21/02; H03K 21/10
[52] U.S. Cl. ........................... 377/117; 377/79; 377/105; 377/111; 377/114; 307/279
[58] Field of Search ............... 377/33, 34, 78, 79, 377/114, 117, 119, 105; 307/279

[56] References Cited

U.S. PATENT DOCUMENTS

| 3,209,347 | 9/1965 | Cutaia | 377/34 |
| 3,322,974 | 5/1967 | Ahrons et al. | 377/79 |
| 3,406,346 | 10/1968 | Wanlass | 377/79 |
| 3,612,900 | 10/1971 | Davies | 377/79 |
| 3,930,169 | 12/1975 | Kuhn | 377/117 |
| 4,181,862 | 1/1980 | Dingwell | 377/117 |
| 4,484,087 | 11/1984 | Mazin et al. | 377/117 |
| 4,703,495 | 10/1987 | Bereznak | 377/34 |
| 4,741,005 | 4/1988 | Tanigawa | 377/119 |

Primary Examiner—John S. Heyman
Attorney, Agent, or Firm—Fliesler, Dubb, Meyer & Lovejoy

[57] ABSTRACT

An improved high speed two phase clock counter is disclosed. The counter includes a plurality of counter cells coupled to a transition pattern recognizer. Through the use of these elements a counter is provided that overcomes the power consumption and size limitation problems associated with known high speed counters.

17 Claims, 5 Drawing Sheets

FIG. 8
BIT UP COUNTER

TWO PHASE NON-OVERLAPPING CLOCK COUNTER CIRCUIT TO BE USED IN AN INTEGRATED CIRCUIT

FIELD OF INVENTION

This invention relates to high speed counters that are utilized in integrated circuits and more particularly counters that can be utilized in Very Large Scale Integration (VLSI) logic chip applications.

BACKGROUND OF THE INVENTION

Two phase clock counter circuits are utilized extensively in integrated circuit applications. Known counter circuits generally have problems that make them difficult to implement in many high speed counting applications.

A first previously known type of counter is referred to as a carry-ripple counter. This counter typically comprises serially coupled T type flip-flop registers in which each register provides one digit of the counter. Accordingly, the counter generates the counts in a serial manner. The problem with this type of counter is that it is very slow.

For those situations where the counter must operate at high speeds serial coupling represents a significant disadvantage. In such an arrangement the clock input of one T flip-flop is coupled to the output of the previous T flip-flop. In so doing, a signal is propagated through all of the gates in the series string to provide the sequential counting. This propagation represents a large number of gate delays when several gates are utilized to provide the digit outputs for the counter. Gate delays represent the additional time required for the counter to perform its function. Hence, this type of counter, although effective for many applications, is undesirable in very high speed applications.

Figure 1:
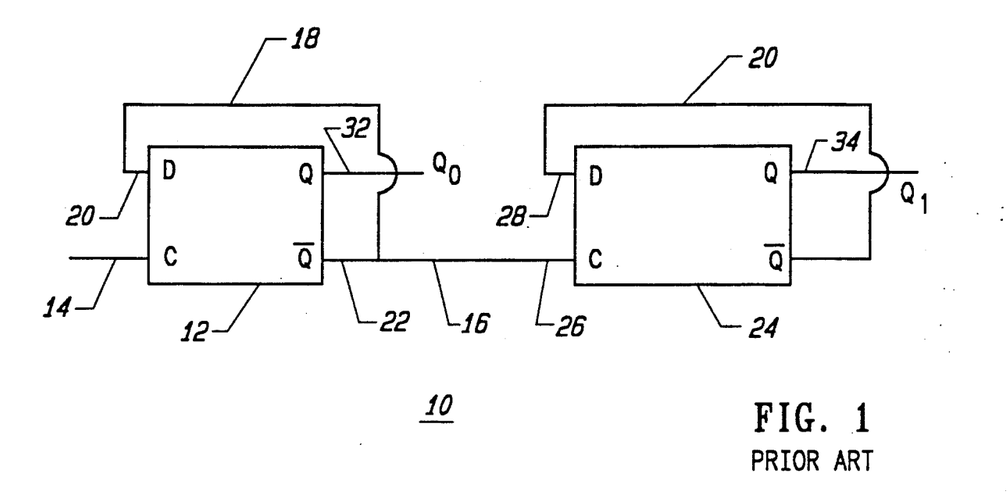
FIG. 1 is a block diagram of a first type of prior art counter.

FIG. 1 depicts, in block diagram form, a typical "carry ripple" counter 10. This counter 10 comprises flip-flops 12 and 24 coupled in a serial counter configuration. In this circuit, an input signal is provided to the clock input of T flip-flop 12 via lin 14. The data termina 20 of T flip-flop 12 is coupled to the complement Q terminal 22 visa line 18. The complement Q terminal 22 is in turn coupled to the clock terminal 26 of the flip-flop 24 via line 16. The data input 28 of flip-flop 24 is coupled to the complement Q terminal of the flip-flop 24 via line 20.

In this embodiment, the Q output terminal 32 of flip-flop 12 provides the "ones" digit of the counter 10 in binary nomenclature. The Q output terminal 34 of flip-flop 24 provides the "twos" digit of counter 10 in binary nomenclauture. Although in this embodiment only two flip-flops are shown coupled in series, it should be understood by one of ordinary skill in the art that any number of these flip-flops can be used depending upon the required application.

Although this type of counter works effectively for its intended purpose, it is not suitable for high speed applications. In this type of carry ripple counter 10, there are a significant number of gate delays that cause this type of counter to be extremely slow when using a number of flip-flops. Therefore, it is necessary to provide a counter that overcomes the above-mentioned speed problems.

An alternative to the above mentioned counter is a parallel counter that includes carry look-ahead logic. This counter has the advantage of providing the counts to the output in parallel thereby significantly increasing the speed of operation. Typically this type of counter comprises an adder that receives the signals representing the counts in a parallel manner and a register for receiving and storing those parallel bits from the adder. Coupled to the adder is logic circuitry for providing the carry-bit to the adder.

Figure 2:
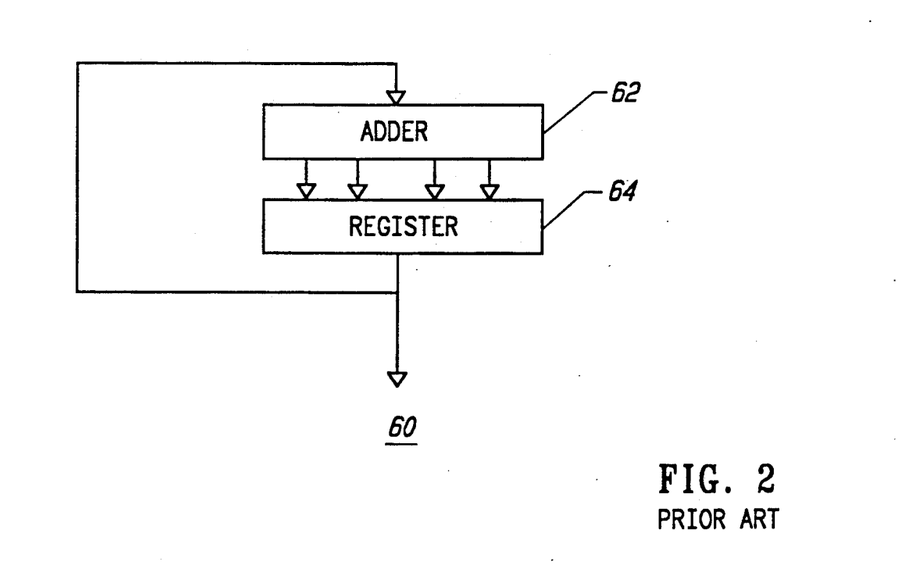
FIG. 2 is a block diagram of a second type of prior art counter.

A parallel counter is shown in FIG. 2. This counter 60 comprises an adder 62 and register 64. In counter 60, the adder 62 includes carry lookahead logic (not shown) and provides the counts to the register 64 in parallel. Register 64 then outputs those bits via line 68. Although counter 60 is much faster than the counter 10 of FIG. 1, it requires complex circuitry in a practical implementation. The problems with this type of counter are clarified with reference to FIG. 3.

Figure 3:
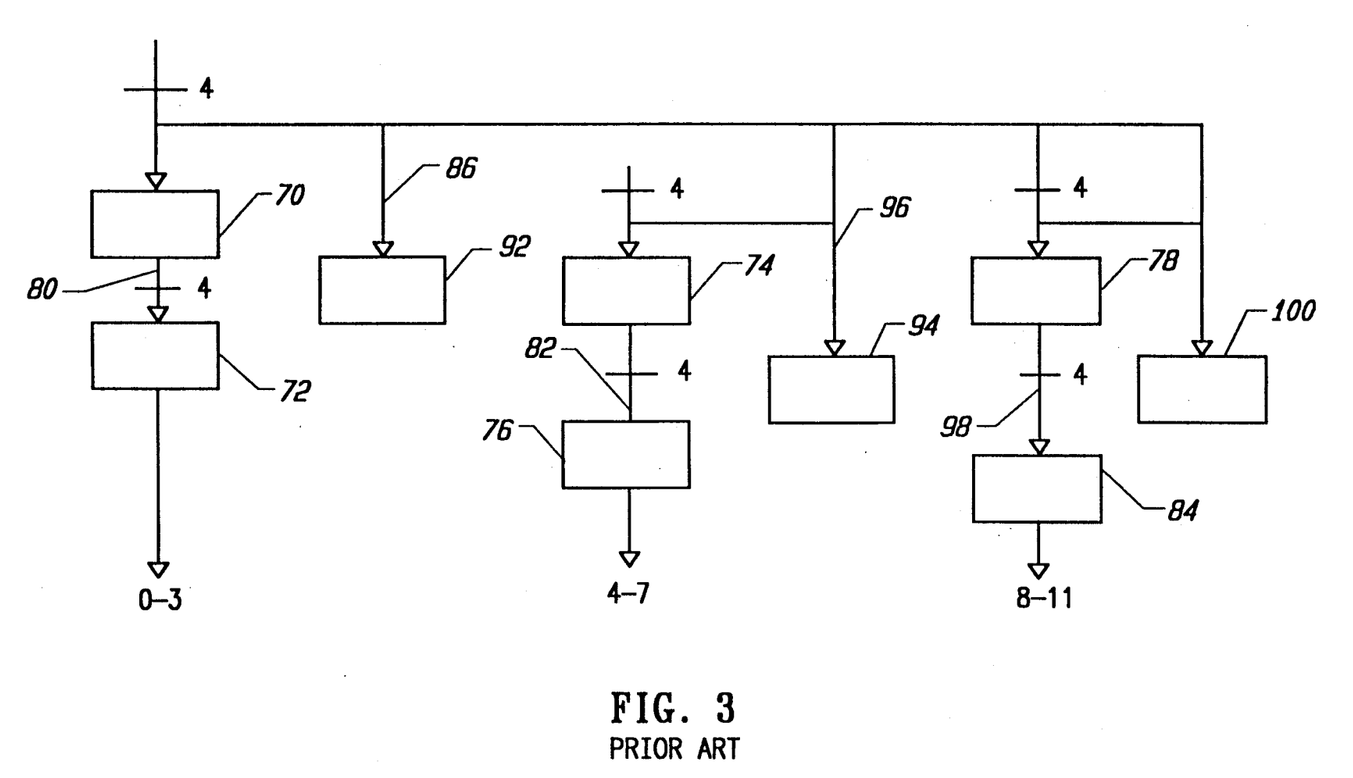
FIG. 3 is a detailed block diagram of the prior art counter of FIG. 2.

FIG. 3 is a more detailed block diagram of a counter 60 shown in FIG. 2. Shown are adders 70, 74, and 78. Each of these adders receive 4 bits of information value. Register 72 is coupled to adder 70 via line 80. Register 76 is coupled to adder 74 via line 82. Register 84 is coupled to adder 78 via line 84. Carry logic circuit 92 is coupled to the input of adder 70 via line 86. Carry logic cicuit 94 is coupled to input of adder 74 via line 96 and is also coupled to carry logic circuit 92. Carry logic circuit 100 is coupled to the input of adder 78 and to the carry logic circuits 92 and 94. In such an embodiment, register 72 outputs bits 0–3, register 76 outputs bits 4–7, and register 84 outputs bits 8–11, all in parallel.

This type of counter is much faster than counter 10 of FIG. 1, but as is seen by the block diagram representation shown in FIG. 3, it is a more complex circuit system than that of FIG. 1.

A parallel counter of this type is significantly faster than a comparable carry ripple counter as described above, however this counter has the disadvantage of requiring additional logic circuitry to provide the carry look-ahead function. In large counter arrays, the speed of the counter is limited by how fast the carry-bit can be computed by the carry-logic. It is known that there is a tradeoff in carry-bit design between the amount of complexity that is required for the carry-bit logic and the amount of die size taken up by that logic. Hence, it is desirable to provide a circuit which does not require this tradeoff. It is also necessary to provide a circuit which can be easily adapted to integrated circuit techniques and processes.

An additional problem with this type of logic circuitry is that it adds significant complexity to the counter, in addition to adding to the overall die size of the counter. These two disadvantages represent a significant cost disadvantage. Firstly, the additional logic circuitry can add expense to the manufacture and production of the integrated circuit that may cause the circuit to be unfeasible from a commercial standpoint.

Secondly, the use of this additional circuitry will significantly increase the power consumption of the circuit. This additional power consumption represent a significant disadvantage in integrated circuit applications and should be avoided whenever possible.

Finally this type of counter has the disadvantage of using an increased amount of die area on the integrated circuit due to the logic circuitry necessary for the carry bit. As is well known, die area is at a premium in integrated circuits. All of the above mentioned disadvantages substantially minimize the advantages of the parallel counter.

Hence, what is needed is a counter which has the advantage of being applicable to high speed applications but none of the disadvantages associated with known high speed counters. In addition, the counter must be capable of practical implementation in integrated circuit technology. Accordingly what is provided in the present invention is a high speed counter that overcomes the above mentioned problems.

SUMMARY OF THE INVENTION

A high-speed two phase clock counter circuit is disclosed. The circuit comprises a plurality of counter cells. Each of the cells are responsive to first and second clock signals to generate output signals representing the count of that particular cell. At least one of the counter cells has one increment control input. At least one of the counter cells has two increment control signals.

Each of the logic cells include a present value stage and a next value stage which are coupled in feedback relationship. Coupled to the plurality of counter cells is a transition pattern recognizer circuit which receives signals from some of the counter cells and provides those signals to the increment controls to change the value of the outputs of those cells. Whenever a counter result is required the second clock signal will be asserted on the counter cells. This will cause the present value stage of each cell to obtain the results stored in the next value stage by transferring charge at a node between the two stages.

Through the use of this system the gate delays are significantly reduced so that the result ca be obtained virtually instantaneously from the cells. At every clock period the counter value is obtained immediately following the second clock signal and the next stage value is also being computed. In so doing, a high speed counter is provided that overcomes the problems associated with previously known counters.

DETAIL DESCRIPTION

The present invention comprises a novel high speed counter utilizing a plurality of counter cells in combination with a transition pattern recognizer. The following description is presented to enable any person skilled in the art to make use of the invention and is provided in the context of a particular application and its requirements. Various modifications to the embodiment will be readily apparent to those of or inary skill in the art and the generic principles defined herein may be applied to other embodiment and applications without departing from the spirit and scope of the present invention. Thus, the present invention is not intended to be limited to the embodiment shown but is to be accorded the widest scope consistent with the principles and features disclosed herein.

Figure 4:
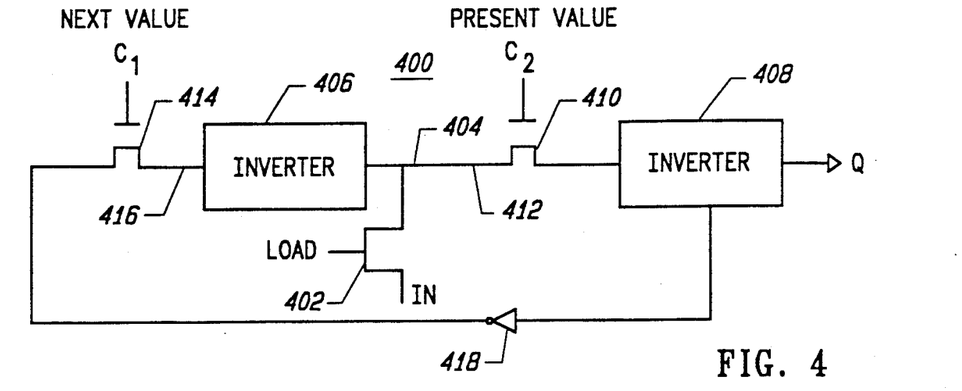
FIG. 4 is a first counter cell in accordance with the present invention.
Figure 5:
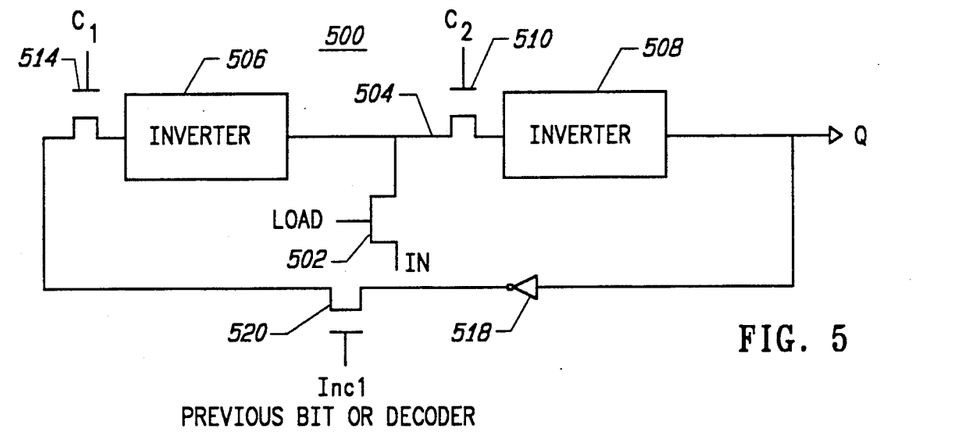
FIG. 5 is a second counter cell in accordance with the present invention.
Figure 6:
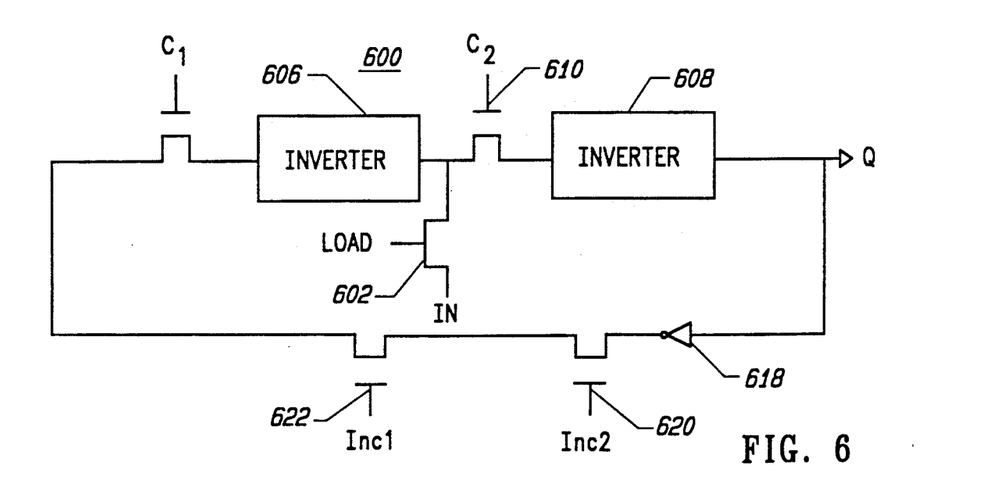
FIG. 6 is a third counter cell in accordance with the present invention.

FIGS. 4-6 depict three counter cells in accordance with the present invention that are utilized in the two phase clock counter.

Referring now to FIG. 4 shown in a first pipe-lined counter cell 400. The counter cell 400 comprises a transistor 402 which includes a gate terminal, for loading a predetermined count in the cell 400. An input signal is provided to the drain of the transistor 402. Therefore, when the gate terminal is loaded, the input signal will be provided to node 404 via the source terminal of transistor 402. The output of inverter 406 is coupled to the drain terminal of transistor 410 via line 412. The input of inverter 406 is coupled to the source of transistor 414 via line 416. The input of inverter 408 is coupled to the source of the transistor 410.

In accordance with the two phase operation of the counter cell 440, transistor 414 receives a first clock signal via its gate terminal. The transistor 410 receives a second, non overlapping clock signal via its gate terminal. The output of inverter 408 provides the output for the counter cell 400. Inverter 418 is coupled in feedback relationship in the counter cell 400. The input of the inverter 418 is coupled to the output of the inverter 408. The output of the inverter 418 is coupled to the drain of the transistor 414.

Counter cell 400 operates in the follow manner. As mentioned above, the cell is loaded by applying a signal to the gate of transistor 402, thereby coupling the input signal provided at the drain of transistor 402 to node 404. When the second clock signal is provided to the gate of transistor 410, the signal node 404 will be provided at the input of inverter 408. During a complete clock switching cycle, (e.g., a firing of both the second clock signal and the first clock signal), it is seen that the signal input at 408 is provided through two inverters and thus the signal provided to the input of the inverter 406 will be the same as that provided at the input of inverter 408. Likewise, the output of inverter 406 will be the complement of the signal output of inverter 408. Thus, upon activating transistor 410 with the second clock signal, the output of inverter 406 is provided to the input of inverter 408.

The cell 400 is thus divided into two stages: the present value stage comprising transistor 410 and, inverter 408 and the next value stage comprising inverter 418, transistor 414, and inverter 406. The inverter 418 provides the next value signal (output from inverter 418) to transistor 414 when the first clock signal is asserted. In this embodiment whenever a counter result is required, the second clock signal will be asserted. By asserting the second clock signal, the present value stage will retrieve the result stored in the next value stage by transferring and amplifying the signal at node 404. Through the use of this counter cell, the present value stage only has one or two gate delays depending on the state of the switching cycle. In so doing, the output of the counter cell 400 will be obtained almost instantaneously.

Referring now to FIG. 5, a second pipeline counter cell 500 is shown. The elements of cell 500 are similar to those of cell 400 except that this cell includes an increment control transistor 520. The drain terminal of transistor 520 is coupled to the output of the inverter 518.

The source terminal of the transistor 520 is coupled to the drain terminal of the transistor 514. The gate terminal of the transistor 520 receives signals to increment or toggle the counter cell 500 as will be explained after a description of FIG. 6.

FIG. 6 depicts a third pipeline counter cell 600 that is similar to that disclosed in FIGS. 4 and except that it includes two increment control transistor, 620 and 622. The drain terminal of transistor 620 is coupled to the output of the inverter 618. The source terminal of transistor 620 coupled to the drain terminal of transistor 622. The source terminal of transistor 622 is coupled to the drain of transistor 614. The gate terminals of transistors 620 and 622 receive signals (specifically described with reference to FIG. 7) to increment or toggle the output of the cell as will be explained hereinbelow.

These counter cells 400, 500 and 600 are preferably used in combination with a transition pattern recognizer to provide a high speed counter that overcomes the problems associated with known counters.

Table 1 depicts a counter comprising 4 bits having outputs $QA_0$–$QA_3$ to count from 0 to 15 (binary 2). Each of the bits has certain transitions during the counting process. For example $Q_0$ *changes state between every cycle*. $Q_1$ changes state after each transition $Q_0$ between 1 and 0. $Q_2$ changes state when $Q_1$ and $Q_0$ are 1. Finally $Q_3$ changes state the cycle after $Q_0$, $Q_1$, and $Q_2$ are 1. These patterns are utilized in conjunction with the above-described counter cells to provide the counter of the present invention.

TABLE 1

| $Q_3$ | $Q_2$ | $Q_1$ | $Q_0$ |
|---|---|---|---|
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 0 | 1 | 1 | 1 |
| 1 | 0 | 0 | 0 |
| 1 | 0 | 0 | 1 |
| 1 | 0 | 1 | 0 |
| 1 | 0 | 1 | 1 |
| 1 | 1 | 0 | 0 |
| 1 | 1 | 0 | 1 |
| 1 | 1 | 1 | 0 |
| 1 | 1 | 1 | 1 |

Figure 7:
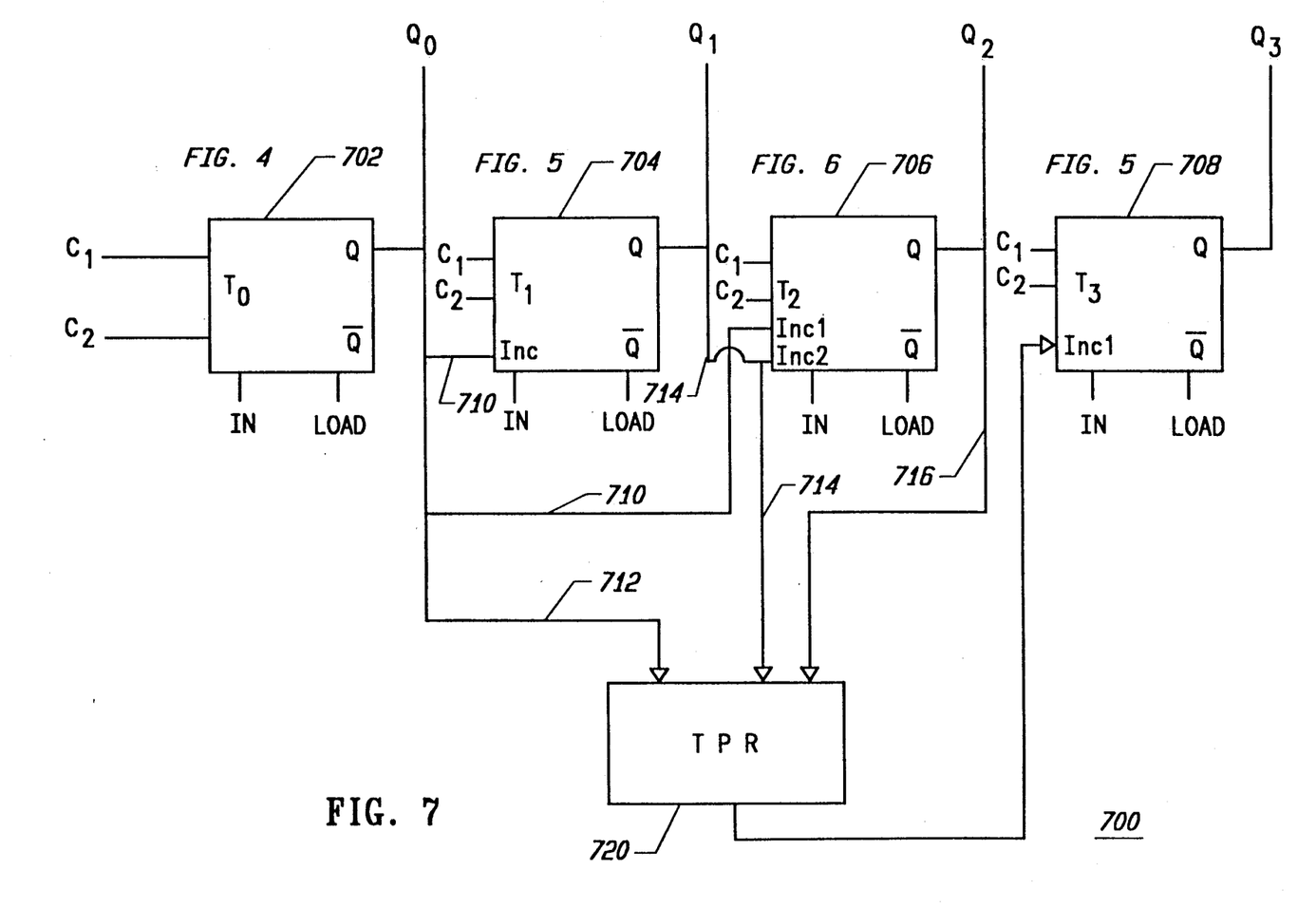
FIG. 7 is a first implementation of a high speed counter circuit that utilizes the counter cells of FIGS. 4-6.

Referring now to FIG. 7, shown is a block diagram implementation of the counter 700 described in Table 1. The counter 700 comprises counter cells 700 –708 and transition pattern recognizer 720. Counter cell 702 is similar to counter cell 400 of FIG. 4 and provides output $Q_0$. Counter cells 704 and 708 are similar to counter cell 500 of FIG. 5 and provide outputs Q and $Q_3$ respectively. Counter cell 706 is similar to counter cell 600 of FIG. 6 and provides output $Q_2$. Attached to the counter cell 702-708 is a transition pattern recognizer 720. In this embodiment, the output of cell 702 is coupled to the increment input of cell 704 and the increment input of cell 706 via line 710. The output of cells 702 2 of cell 706, 704 are presented to the incremental inputs and respectively, via lines 710 and 712. The outputs from cells 702, 704 and 706 are provided to the transition pattern recognizer via lines 710, 714 and 716 respectively. The output of the recognizer is provided to the increment input of counter cell 708.

It has been found that these three types of counter cells , used in conjunction with the pattern recognizer 720, can be utilized to perform the counting for high speed applications with a minimum of logic circuitry and low power consumption.

The counter 700 operates in the following manner. When the second clock signal is asserted the cells provide the counts to the outputs $QA_0$ –$Q_3$, respectively. The output signals from cell 702 are provided to increment input of cell 704 to provide the proper transitions. The outputs of cells 702 and 704 increment the output of cell 706 such that the output of cell 706 is high after outputs of cell 702 and 704. Then after the outputs of cells 702-706 are high the output 708 will go high through operation of pattern recognizer 720.

In this embodiment the transition pattern recognizer is a AND gate although it could be a variety of other types of circuitry and their use would be within the spirit and scope of the present invention.

A typical approach to the implementation of this counter would be to have one counter cell with a plurality of increment control signals. It has been found that it is not practical to have more than two increment control inputs to a cell. Too may increment control transistors create the problem of too much propagation delay through the increment control transistor thus slowing down the speed of the counter. Therefore the pattern recognizer serves as a min term generator that provides signals to the appropriate counter cells. The min terms are generated by the transition pattern recognizer to toggle the cell 700 in accordance with a predetermined pattern.

Figure 8:
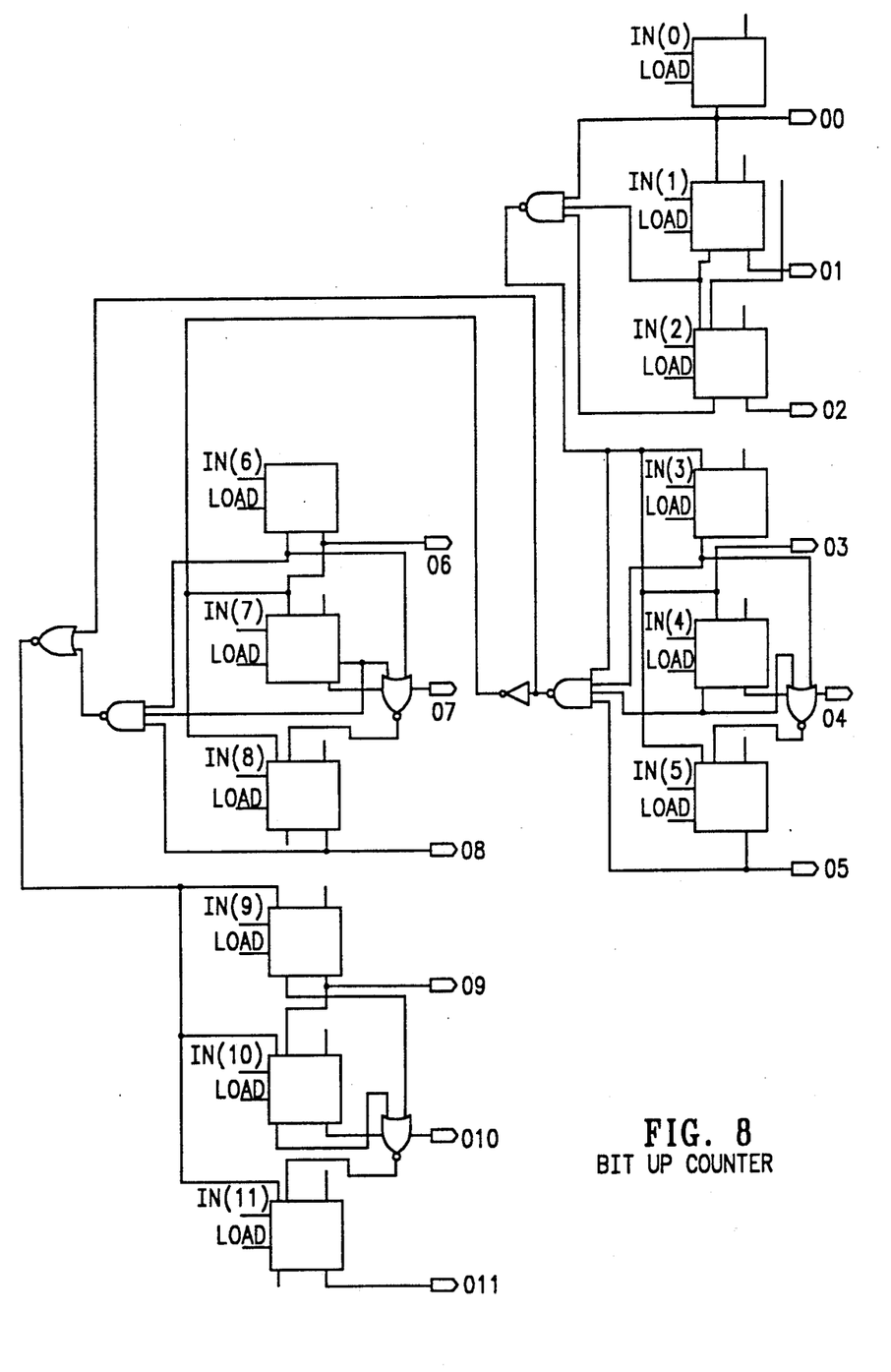
FIG. 8 is a second implementation of a high speed counter circuit in accordance with the present invention.

Accordingly, when the counter is large, for example having 12 bits, the pattern recognizer can be utilized with the cells to provide the counts. Such a counter is shown in FIG. 8. As is seen this counter comprises 12 counter cells which either have 0, 1 or 2 increment control inputs. This embodiment utilizes a transition pattern recognizer of 5 NOR gates, 2 NAND gates and 1 inverter. In this embodiment, therefore, the longest data path of the counter is a propagation delay of three gates.

Through the use of the disclosed counter cells in conjunction with a transition pattern recognizer, it has been shown that a high speed counter is provided that overcomes the problems associated with known high speed counters. Through the use of the novel counter cells in conjunction with the recognizer the carry logic circuitry utilized in previously known counters has been eliminated. This counter has significant utility in integrated circuit technology.

It should be understood that the present invention has been disclosed in context of specific embodiments. However, it should be recognized by one of ordinary skill in the art that various modifications can be made and they would be within the spirit and scope of the present invention.

For example, the present invention is described in the context of an up counter, it would be within the spirit and scope of the present invention to provide a down counter. It is also recognized that the transition recognizer can be a variety of logic devices and those devices would be within the scope of the present invention. Accordingly, the present invention is accorded its widest scope in conjunction with the following claims.

What is claimed is:

1. A counter call to be utilized in a two phase clock counter circuit, the cell having first and second clock signal inputs for receiving first and second clock signals, and having an output, said counter cell consisting of:
- a present value stage for providing an output signal representing the count of said cell, said present value stage including an input, a first passgate coupled to said input and including means for receiving the second clock signal, and a first inverter, having an input and an output, said first inverter being coupled to said first passgate for transferring the logical inverse of data information present at its input to its output and to the output of said cell responsive to said second clock signal;
- a second inverter, having an input and an output, said input of said second inverter being coupled to said output of said first inverter;
- a next value stage for providing data information to the input of said present value stage, said next value stage including a second passgate, responsive to said first clock signal, and a third inverter coupled to said second passgate for transferring data information to said present value stage input responsive to said first clock signal;
- means, coupled to the output of said counter cell, for providing a control signal;
- an increment control passgate coupled to said second inverter and responsive to said control signal for selectively coupling the output signal to said second inverter; and
- means for inputting both a logical one or logical zero to said counter cell coupled to said present value stage input.

2. The clocked counter cell of claim 1 wherein said means for data input comprises a fourth passgate having an input, an output, and a passgate enable input, wherein said output of said fourth passgate is coupled to the input of said first passgate and a data signal is applied to said input of said fourth passgate, said data signal being input to said counter cell responsive to a control signal applied to said gate enable input of said fourth passgate.

3. The clock circuit of claim 1 wherein said first clock signal occurs during a first time interval and said second clock signal occurs at a second time interval, wherein said first and second time intervals are non-overlapping.

4. A counter cell to be utilized in a two phase clock counter circuit, the cell having first and second clock signal inputs for receiving first and second clock signals, and having an output, said counter cell consisting of:
- a present value stage for providing an output signal representing the count of said cell, said present value stage including an input, a first passgate coupled to said input and including means for receiving the second clock signal, and a first inverter, having an input and an output, said first inverter being coupled to said first passgate for transferring the logical inverse of data information present at its input to its output and to the output of said cell responsive to said second clock signal;
- a second inverter, having an input and an output, said input of said second inverter being coupled to said output of said first inverter;
- a next value stage for providing data information to the input of said present value stage, said next value stage including a second passgate, responsive to said first clock signal and a third inverter coupled to said second passgate for transferring data information to said present value stage input responsive to said first clock signal;
- means, coupled to the output of said counter cell, for providing first and second increment signals;
- a first and second increment control passgates, coupled between said second inverter and said next value stage, responsive to said first and second increment signals, respectively, for selectively coupling said output signal of said second inverter to said next value stage; and
- means for inputting both a logical one or logical zero to said counter cell coupled to said present value stage input.

5. The clocked counter cell of claim 4 wherein said means for data input comprises a fifth passgate having an input, an output, and a passgate enable input, wherein said output of said fifth passgate is coupled to the input of said first passgate and a data signal is applied to said input of said fifth passgate, said data signal being input to said counter cell responsive to a control signal applied to said gate enable input of said fifth passgate.

6. The clock counter circuit of claim 4 wherein said first clock signal occurs during a first time interval and said second clock signal occurs at a second time interval, wherein said first and second time intervals are non-overlapping.

7. A clocked counter cell including means for providing an output signal, consisting of:
- a first inverter means, having an input and an output, for providing a signal to its output which is the logical inverse of a signal applied to its input;
- a first passgate, having an input and an output, for selectively passing a signal responsive to a first clock signal, said first passgate output being coupled to the input of said first inverter means;
- a second inverter means, having an input and an output, for providing a signal to its output which is the logical inverse of a signal applied to its input, wherein said second inverter output is coupled to said first passage input;
- a second passgate, having an input and an output, for selectively passing a signal responsive to a second clock signal, and having its output coupled to said second inverter input;
- a third inverter means having an input coupled to said first inverter output, and an output coupled to said second passgate input, for providing a signal to its output which is the inverse of a signal applied to its input; and
- means for inputting both a logical one or logical zero to said counter cell coupled to said first passgate input.

8. The clocked counter cell of amended claim 7 wherein each of said passgates further includes a passgate enable input coupled to one of said clock signals.

9. The clocked counter cell of claim 8 wherein said means for data input comprises a third passgate having an input, an output, and a passgate enable input, wherein said output of said third passgate is coupled to the input of said first passgate and a data signal is applied to said input of said third passgate, said data signal being input to said counter cell responsive to a control signal applied to said gate enable input of said third passgate.

10. The clock counter circuit of claim 7 wherein said first clock signal occurs during a first time interval and said second clock signal occurs at a second time interval, wherein said first and second time intervals are non-overlapping.

11. A clocked counter circuit, comprising:
a plurality of counter cells, each of said counter cells including means for providing an output signal and consisting of:
 a first inverter means having an input and an output for providing a signal to its output which is the inverse of a signal applied to its input,
 a first passgate, having an input and an output, for passing a signal responsive to a first clock signal, said first passgate output being coupled to the input of said first inverter means,
 a second inverter means, having an input and an output, for providing a signal to its output which is the logical inverse of a signal applied to its input, said second inverter output being coupled to said first passgate input,
 a second passgate, having an input and an output for passing a signal responsive to a second clock signal, said second passgate output being coupled to said second inverter input,
 a third inverter means, having an input coupled to said first inverter output and an output coupled to said second passgate input, for providing a signal to its output which is the logical inverse of a signal applied to its input, and
 means for inputting both a logical one or logical zero coupled to said first passgate input;
at least a first and second ones of said plurality of counter cells further including a third passgate, having an input and an output, wherein said third passgate input a coupled to the output of said third invertere means, said at least first one of said plurality having said third passgate output coupled to the input of said second passgate, and said at least a second one of said plurality of counter cells further including a fourth passgate having an input and an output, said fourth passgate having its input coupled to said third passgate output and its output coupled to said second passgate input; and
means, coupled to the outputs of a subset of said plurality of counter cells and to said third and fourth passgates, for enabling the signal input to said third and fourth passgates to pass to said third and fourth passgate outputs, respectively.

12. The clocked counter circuit of claim 11 wherein each said passgate further includes a gate enable input for enabling the signal at said passgate input to pass to said passgate output.

13. The clocked counter circuit of claim 12 wherein said means for data input comprises a fifth passgate having an input, an output, and a gate enable input, wherein said output of said fifth passgate is coupled to said input of said first passgate and a data signal is applied to said input of said fifth passgate, said data signal being input to said counter cell responsive to a control signal applied to said gate enable input of said fifth passgate.

14. The clocked counter circuit of claim 12 wherein said means for enabling the signal input to said third passgate comprises a NAND gate.

15. The clocked counter circuit of claim 14 wherein said NAND gate output is applied to said gate enable input of said third passgate.

16. The clocked counter circuit of claim 12 wherein said means for enabling said third passgate comprises a NOR gate having an output coupled to the gate enable input of said third passgate, said NOR gate further including at least two inputs, one of said NOR gate inputs being coupled to the output of one of a plurality of NAND gates, said one of a plurality of NAND gates having inputs coupled to the outputs of a first subset of said plurality of counter cells, and another of said NOR gate inputs being coupled to the output of a second NAND gate, said second NAND gate having inputs coupled to the outputs of a second subset of said plurality of counter cells.

17. A clocked counter circuit, comprising:
a plurality of counter cells, each of said counter cells including means for providing an output signal and comprising
 a first inverter means having an input and an output for providing a signal to its output which is the inverse of a signal applied to its input,
 a first passgate, having an input and an output, for passing a signal responsive to a first clock signal, said first passgate output being coupled to the input of said first inverter means,
 a second inverter means, having an input and an output, for providing a signal to its output which is the logical inverse of a signal applied to its input, said second inverter output being coupled to said first passgate input,
 a second passgate, having an input and an output for passing a signal responsive to a second clock signal, said second passgate output being coupled to said second inverter input,
 a third inverter means, having an input coupled to said first inverter output and an output coupled to said second passgate input, for providing a signal to its output which is the logical inverse of a signal applied to its input, and
 means for inputting data coupled to said first passgate input;
at least one of said plurality of counter cells further including a third passgate, having an input and an output, wherein said third passgate input coupled to the output of said third inverter means, and said third passgate output is coupled to the input of said second passgate;
wherein each said passgate further includes a gate enable input for enabling the signal at said passgate input to pass to said passgate output; and
means, coupled to the outputs of a subset of said plurality of counter cells and to said third passgate, for enabling the signal input to said third passgate to pass to said third passgate output, said means comprising a NOR gate having an output coupled to the gate enable input of said third passgate, said NOR gate further including at least two inputs, one of said NOR gate inputs being coupled to the output of one of a plurality of NAND gates, said one of a plurality of NAND gates having inputs coupled to the outputs of a first subset of said plurality of counter cells, and another of said NOR gate inputs being coupled to the output of a second NAND gate, said second NAND gate having inputs coupled to the outputs of a second subset of said plurality of counter cells.

* * * * *